(12) United States Patent  
Carpenter

(10) Patent No.: US 9,059,366 B2  
(45) Date of Patent: Jun. 16, 2015

(54) BONDING OF PHOTOVOLTAIC DEVICE TO COVERING MATERIAL

(75) Inventor: Bernie F. Carpenter, Albuquerque, NM (US)

(73) Assignee: The Aerospace Corporation, El Segundo, CA (US)

( * ) Notice: Subject to any disclaimer, the term of this patent is extended or adjusted under 35 U.S.C. 154(b) by 387 days.

(21) Appl. No.: 13/453,128

(22) Filed: Apr. 23, 2012

(65) Prior Publication Data

US 2013/0276875 A1   Oct. 24, 2013

(51) Int. Cl.
| | |
|---|---|
| H01L 31/042 | (2014.01) |
| H01L 21/00 | (2006.01) |
| H01L 31/18 | (2006.01) |
| H01L 31/048 | (2014.01) |
| B05D 5/12 | (2006.01) |

(52) U.S. Cl.
CPC .............. *H01L 31/18* (2013.01); *H01L 31/048* (2013.01); *H01L 31/0481* (2013.01)

(58) Field of Classification Search
CPC ..................... H01L 31/06875; H01L 31/0725; H01L 31/018; H01L 31/048; H01L 31/0481; H01L 2224/32225; H01L 2924/01322
USPC ............ 156/329, 275.7, 272.2, 275.5; 427/74
See application file for complete search history.

(56) References Cited

U.S. PATENT DOCUMENTS

| | | | |
|---|---|---|---|
| 8,491,718 B2 | 7/2013 | Chaudhari | |
| 2008/0185038 A1* | 8/2008 | Sharps | 136/255 |
| 2009/0011222 A1* | 1/2009 | Xiu et al. | 428/323 |
| 2010/0237272 A1 | 9/2010 | Chaudhari | |

OTHER PUBLICATIONS

Choosing a Silicone Encapsulant for Photovoltaic Applications, Michelle Velderrain, presented at the CPV-7 Conference in Las Vegas, NV (Apr. 2010).

Deep Eutectic Solvents Formed between Choline Chloride and Carboxylic Acids: Versatile Alternatives to Ionic Liquids, Andrew P. Abbott, David Boothby, Glen Capper, David L. Davies, and Raymond K. Rasheed, J|A|C|S Articles (Published on Web Jul. 1, 2004).

Recent Developments in Ultra Low Outgassing Silicones for Space Applications, Bill Riegler, Brian Burkitt, Vincent Malave, Roy Johnson, and Rob Thomaier, presented at the 11th Japan International SAMPE Conference (JISSE-11), Tokyo, Japan (Nov. 2009).

Solubility of Metal Oxides in Deep Eutectic Solvents Based on Choline Chloride, Andrew P. Abbott, Glen Capper, David L. Davies, Katy J. McKenzie, and Stephen U. Obi, J. Chem. Eng. Data 2006, 51, 1280-1282 (2006).

The Determination of Solubility Parameters of Solvents and Polymers by Means of Correlations with Other Physical Quantities, D. M. Koenhen and C. A. Smolders, Journal of Applied Polymer Science, vol. 19, pp. 1163-1179 (1975).

* cited by examiner

*Primary Examiner* — Jennifer K. Michener  
*Assistant Examiner* — Marla D McConnell  
(74) *Attorney, Agent, or Firm* — LeonardPatel PC

(57) ABSTRACT

A solar energy collection system includes a solar cell, a transparent covering, and a eutectic interlayer binding the solar cell and the transparent covering together. At least some of a compound of the eutectic interlayer bonds with the transparent covering, raising the melting temperature of the eutectic interlayer above the melting temperature with the full amount of the compound present.

8 Claims, 12 Drawing Sheets

BONDING OF PHOTOVOLTAIC DEVICE TO COVERING MATERIAL

FIELD

The present invention generally relates to bonding of photovoltaic devices, and more specifically, to improved bonding of a photovoltaic device to a transparent covering material via a eutectic interlayer.

BACKGROUND

Conventional photovoltaic systems use arrays with rigid panel structures that act as substrates for gallium arsenide (GaA) and Germanium (Ge)-based multi-junction solar cells. For systems deployed for operation in space, such as satellites and spacecraft, these arrays are generally designed such that bending strain encountered during launch and thermal mismatch strains developed during orbit do not crack the relatively fragile solar cells. Typically, low modulus silicone adhesives are deposited between dissimilar materials, such as the solar cells and coverglass. For example, space-qualified optical adhesives such as DC93-500 by Dow Corning® or SCV-2590 by NuSil® may be used.

Inverted metamorphic photovoltaic devices (IMMs) have exhibited certain beneficial conversion properties as compared with conventional multi-junction solar cells. For instance, IMMs offer higher efficiency and significantly lower mass compared to standard crystalline multi-junction photovoltaics. Further, IMMs may increase array level specific power with a minimal deployed area. However, IMMs have dramatically different mechanical properties than traditional solar cells due to their flexible nature. IMMs are also more prone to cracking and are difficult to handle as freestanding entities. Further, where conventional silicone-based adhesives are used, deleterious forces may be transferred to the relatively fragile IMM cells.

SUMMARY

Certain embodiments of the present invention may provide solutions to the problems and needs in the art that have not yet been fully identified, appreciated, or solved by current bonding technologies for photovoltaic devices. For example, some embodiments of the present invention utilize a eutectic interlayer to bond photovoltaic cells to a transparent covering material, such as coverglass.

In one embodiment, an apparatus includes a solar cell, a transparent covering, and a eutectic interlayer binding the solar cell and the transparent covering together. At least some of a compound of the eutectic interlayer bonds with the transparent covering, raising the melting temperature of the eutectic interlayer above the melting temperature with the full amount of the compound present.

In another embodiment, a method includes placing a eutectic layer in a solid or liquid state in contact or close proximity to a solar cell. The method also includes heating the eutectic layer to a sufficiently high temperature to transition to a liquid state. The liquid eutectic interlayer wets a surface of the solar cell, covering surface components of the solar cell. The method further includes modifying a chemistry of the eutectic layer such that the eutectic layer solidifies on the surface of the solar cell, forming a transparent layer.

In yet another embodiment, a method includes placing a eutectic layer in contact or close proximity to a solar cell and heating a process chamber. The method also includes increasing a concentration of a gas in the process chamber that causes the eutectic layer to transition into a liquid state such that the eutectic layer coats a surface of the solar cell. The method further includes lowering the concentration of the gas such that the eutectic layer solidifies on the surface of the solar cell, forming a transparent covering.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Figure 1:
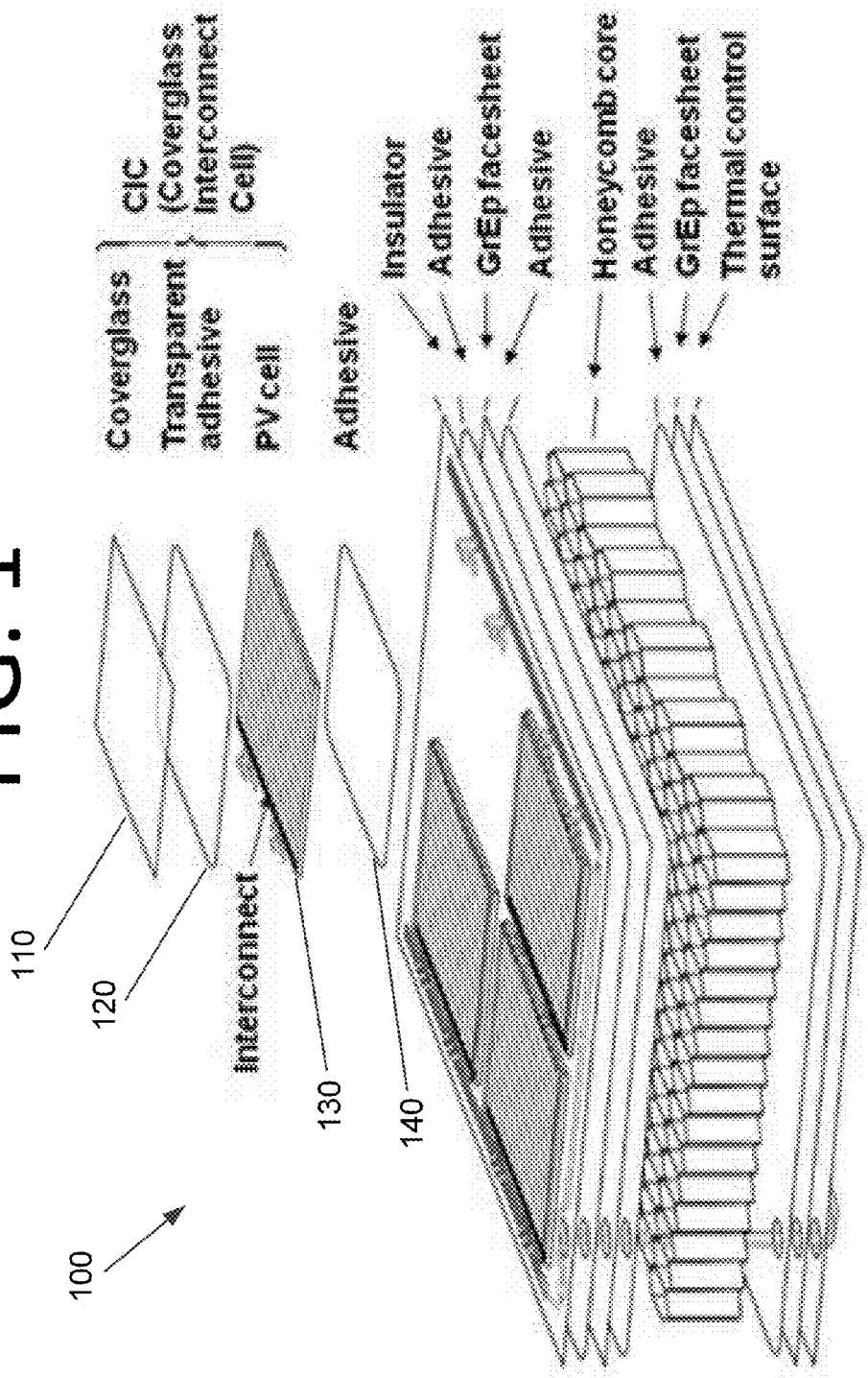
FIG. 1 illustrates a conventional solar array assembly.

It will be readily understood that the components of the present invention, as generally described and illustrated in the figures herein, may be arranged and designed in a wide variety of different configurations. Thus, the following detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, the usage of "certain embodiments," "some embodiments," or other similar language, throughout this specification refers to the fact that a particular feature, structure, or characteristic described in connection with the embodiment may be included in at least one embodiment of the present invention. Thus, appearances of the phrases "in certain embodiments," "in some embodiments," "in other embodiments," or other similar language, throughout this specification do not necessarily all refer to the same group of embodiments, and the described features, structures, or characteristics may be combined in any suitable manner in one or more embodiments.

Some embodiments of the present invention bond a photovoltaic cell to a transparent covering with a eutectic interlayer. A eutectic material has a lower melting point than any of its individual constituent chemical compounds or elements. The eutectic interlayer also has a lower liquid phase transition temperature initially, but the liquid phase transition temperature rises as one or more compounds within the eutectic interlayer bond with the transparent covering. The transparent covering generally should be thick enough relative to the thickness of the eutectic interlayer such that diffusion does not appreciably change the composition of the covering. This generally allows the bonding layer to be smaller (20-50 microns or less in some embodiments) than when conventional silicone-based adhesives are used (typically 2-4 mils, or 50.8-101.6 microns).

However, in some embodiments, a separate transparent covering is not needed. For instance, a eutectic layer may be applied to the photovoltaic cell without coverglass or another covering. The atmosphere in the process chamber may be adjusted such that diffusion occurs from the liquid eutectic layer to the surrounding gas, resulting in isothermal solidification. The gas in the process chamber flows such that it acts as a sink in a similar manner to the coverglass. The volume of the gas should be large enough such that local equilibrium is not attained.

In certain embodiments, a different type of liquid-to-gas interaction may be used. In such embodiments, a component of the gas may be responsible for suppressing the melting point of the liquid layer. For example, oxygen, water vapor, or another suitable element may be used to suppress the melting point of an optically transparent material (i.e., the liquid layer). Liquid would form as a result of having the correct mole fraction of oxygen, but then isothermally solidify as the oxygen content of the process chamber is altered by changing the composition of the surrounding atmosphere. A flowing gas mixture may be controlled such that the desired composition change occurs. These processes, in effect, create a "virtual" coverglass once the eutectic layer solidifies on the surface of the cell.

FIG. 1 illustrates a conventional solar array assembly 100. Coverglass 110 is bonded to a solar cell 130 by means of a first adhesive layer 120 including a transparent silicone-based adhesive. A second adhesive layer 140 bonds solar cell 130 to the remainder of solar array 100.

However, there are several problems with conventional solar arrays, particularly with respect to applications in space. For instance, vendors have developed low outgassing silicone compositions that may be used in first adhesive layer 120, and these compositions may become contamination sources when used in concentrator applications under sustained high temperature exposure. Further, potential exists for batch-to-batch variations for space products. These products represent a relatively small segment of the photovoltaic market and there is little incentive to troubleshoot or optimize process control. However, eutectic interlayer materials of some embodiments of the present invention do not become contamination sources under these conditions.

Also, silicone compositions experience dramatic changes in low temperature mechanical compliance, especially at exposure temperatures less than the silicone glass transition temperature. The true glass transition temperature is generally around $-120°$ C. However, between $-40°$ C. and $-70°$ C., the modulus (hardness) generally begins to increase significantly. Such low temperatures are common for operating conditions in space, for example. While low mechanical stiffness and high strain capability over a fairly broad temperature range are advantages of using silicone adhesives, these advantages are not present at such low exposure temperatures. Some embodiments of the eutectic interlayer materials of the present invention do not experience dramatic changes in mechanical compliance at low temperatures.

Further, ultraviolet (UV) exposure at the silicone bonding layer, such as first adhesive layer 120, causes silicone bonding agents to darken. This is normally prevented by using ceria ($CeO_2$) doped glass that prevents substantial transmission of UV radiation to the adhesive layer. For new multi-junction devices, it may be desirable to alter the doping concentration to allow a higher fraction of near-UV such that the GaInP top junction can take advantage of converting more of this portion of the spectrum. Some embodiments of the eutectic interlayer materials of the present invention do not substantially darken with UV exposure, and as such, addition of ceria is not necessary. This allows a broader range of the solar spectrum to be harnessed and converted into electricity.

With respect to IMMs, use of silicone-based bonding materials may allow deleterious forces to be transferred to the relatively fragile IMM cells. Some embodiments of the present invention overcome this problem by using an adhesive-free bonding agent that increases stiffness without introducing residual stresses that could bend or crack the cell assembly. Isothermal solidification involving a temporary liquid phase provides a mechanism of joining a transparent covering material, such as glass, to IMMs. Non-glass materials, such as certain plastics, are also possible. However, for embodiments intended to operate in space, the polymer should generally have adequate resistance to degradation. For many materials, properties change quickly when exposed to radiation, atomic oxygen, or UV radiation. The polymer film Tezfel® is used for many terrestrial photovoltaic applications. Initially the covering surface is prepared with a eutectic interlayer placed in mechanical contact with the IMM surface. The assembly is heated above the eutectic temperature, resulting in an interfacial liquid film. Surface tension wets the IMM surface oxide layer such that the resulting force balance causes the IMM to flatten against the glass. Solidification may proceed at a constant temperature as diffusion alters the liquid composition according to the respective phase transition properties.

During the diffusion stage, the covering behaves as a sink, reducing the composition gradient. Generation of a graded spinel crystal structure increases the fracture toughness of the joint—a beneficial attribute for cells exposed to thermal cycling. Isothermal joints are expected to be resistant to degradation phenomena normally observed for space-grade silicone materials.

Figure 2:
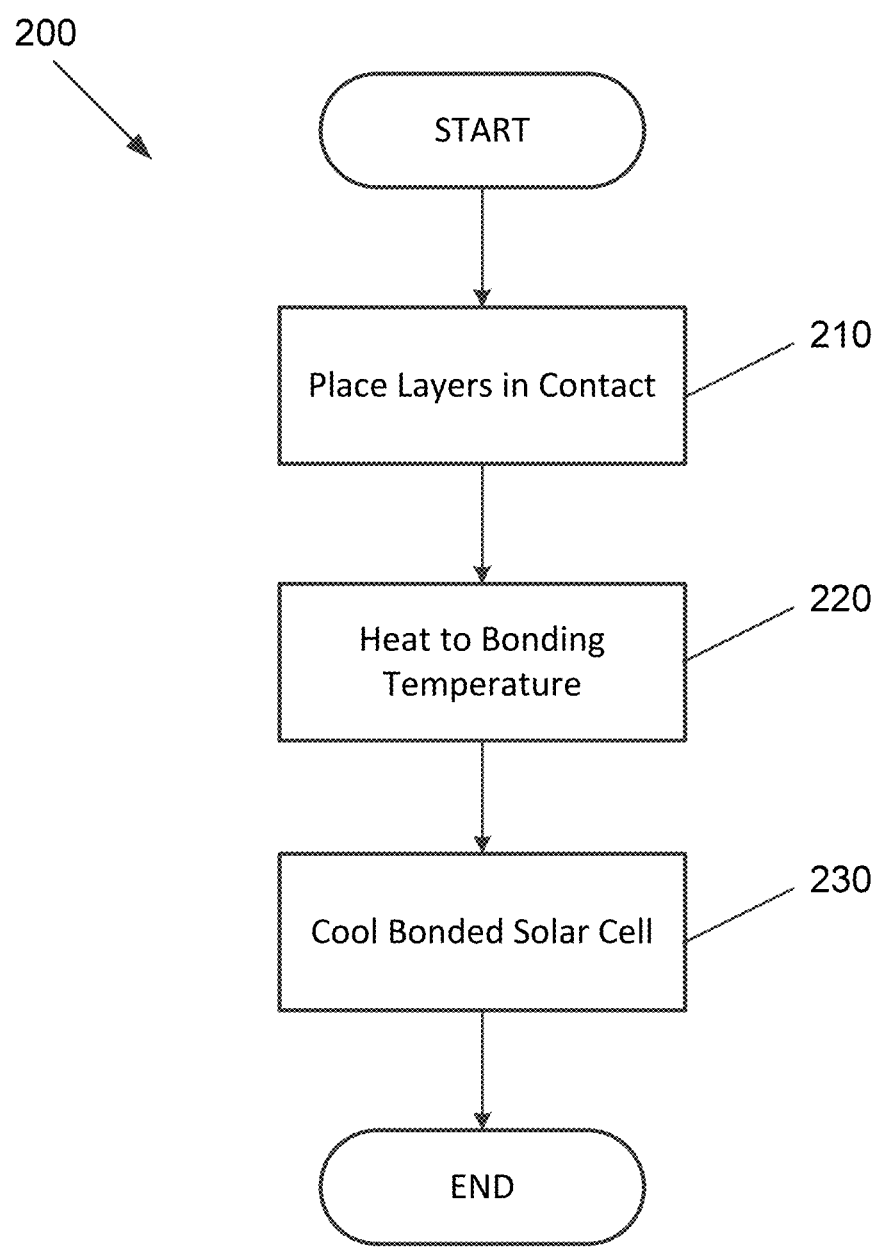
FIG. 2 is a flowchart illustrating a method for bonding a solar cell to a transparent material using a eutectic interlayer, according to an embodiment of the present invention.

FIG. 2 is a flowchart 200 illustrating a method for bonding a solar cell to a transparent covering using a eutectic interlayer, according to an embodiment of the present invention. First, the surfaces of the layers are placed in contact with one another at 210 such that the transparent covering contacts, or is bonded to, one side of the eutectic interlayer, and the solar cell contacts the other side of the eutectic interlayer. In many embodiments, one side of the covering may have previously been treated with the eutectic interlayer material, bonding the interlayer material to the covering. The layers are then heated to the bonding temperature at 220.

At the bonding temperature, a liquid film of the eutectic interlayer material forms and spreads across the solar cell surface under the forces of surface tension. The liquid generally forms according to a known and predictable phase diagram. A substance within the eutectic interlayer material diffuses into the transparent covering, altering the composition of the eutectic interlayer material and causing the interlayer material to solidify at the bonding temperature. The diffusion continues with the transparent covering acting as a sink, completing the bonding process when the eutectic interlayer material completely solidifies. A "sink" refers to a relatively large volume of material in which constituents of the liquid film can diffuse without globally changing the composition of the material. For instance, in many embodiments, coverglass has a large volume compared to that of the liquid film. The bonded solar cell and covering are then cooled at 230. It should be noted that generally, cooling is not intended for layer solidification, as this will occur at the initial melting temperature. As such, this process may be differentiated from brazing or soldering processes.

The method of FIG. 2 may be used with IMMs to create solar arrays that are superior to conventional systems. IMMs have demonstrated beneficial conversion efficiencies (from 33% demonstrated to 37% projected) as compared to conventional multi-junction solar cells. In addition, the thin, flexible IMMs have the potential to increase array level specific power with minimum deployed area due to their lightweight and flexible nature.

However, the transition from conventional rigid cells to flexible cells introduces dramatically different mechanical properties restricting use of traditional assembly practices. While use of silicone-based adhesives to join IMMs to coverglass would appear to provide a convenient carrier allowing use of traditional integration techniques, excessive mechanical compliance of the bond layer allows deleterious forces to be transferred to the fragile IMM cells. As such, the use of an adhesiveless eutectic interlayer for bonding that increases stiffness without introducing residual stresses that could bend or crack the cell assembly is superior for such systems. Isothermal solidification involving a temporary liquid phase provides a mechanism of joining coverglass to an IMM.

Initially, the coverglass surface may be prepared with a deep eutectic interlayer placed in mechanical contact with the IMM surface. It is not necessary to apply pressure to the IMM using weights or a vacuum bag in many embodiments. The assembly is heated above the eutectic temperature, resulting in an interfacial liquid film. Surface tension wets the IMM surface oxide layer such that the resulting force balance from surface tension causes the IMM to flatten against the glass. The liquid layer may be no more than 50 microns thick in many embodiments. Thickness in this process may become difficult to explicitly define since the diffusion process involves penetration of a substance of the eutectic interlayer into the coverglass. However, the thickness may be sufficient to accommodate height differences across the IMM surface from various components that are present in IMMs.

Solidification proceeds at constant temperature as diffusion alters the liquid composition according to a known phase diagram. During the diffusion stage, the coverglass behaves as a sink, reducing the composition gradient. During this phase, optical properties may be restored as both bond thickness and composition approach their limiting boundaries.

Conventional chemical joining methods outside the field of adhesive bonding involve high temperature exposure that exceeds the survivability tolerances of multi-junction cells. Although there is the potential for short-term high temperature exposure, cell vendors generally recommend not to exceed approximately 300° C. Liquid layer formation is not just a transitional phase, but also compensates for small height differences on the surface of cells and is responsible for establishing bond layer thickness. Using isothermal solidification instead of conducting low temperature "optical brazing" develops a transitional microstructure for alleviating thermal stress.

Compositionally stepgraded structures have been shown to alleviate mismatch strain in multilayer epitaxial devices. The method is similar. However, gradation results from diffusion processes. In addition, isothermal solidification is designed to promote formation of a spinel structure with high remelt temperature. High temperature crystal structures of this nature generally have characteristically high fracture toughness and strength. Spinels also have the useful characteristic of accommodating a wide range of compositions. The crystal structure may have the form of $MgAl_2O_4$ and basically be a convolved cubic with oxygen ions forming the face-centered cubic (FCC) lattice component.

In general, the eutectic interlayer material may have the following features: (1) generation of a spectrally transparent interface upon completion of the process; (2) liquid formation at temperatures less than those associated with cell degradation; (3) a liquid layer that demonstrates low surface tension on both the cell surface and the cover glass; (4) a limited solubility for constituents of the cell top layer; and (5) the ability to form resilient high temperature microstructures. Mixtures of quaternary salts have been shown to have eutectic temperatures approaching near-ambient conditions. These salts have been termed "deep eutectic solvents" to differentiate them from traditional ionic liquids. Based on extension of initial investigations with ammonia, low temperature chlorine eutectics have demonstrated solubility for a wide range of oxides as shown in Table 1 below. While $TiO_2$, $CoO$, $CuO$, $Cu_2O$, and $ZnO$ are listed, it is understood that other oxides or suitable substitutes may be used.

TABLE 1

| | Solubility (ppm) of Oxides in Deep Eutectic Solvents | | | |
|---|---|---|---|---|
| Oxide | Malonic Acid (50° C.) | Malonic Acid Complex | Carbamide (50° C.) | Carbamide (70° C.) |
| $TiO_2$ | 4 | — | 0.5 | — |
| CoO | 3626 | — | 13.6 | — |
| CuO | 14008 | $CuCl_3$ | 4.8 | 234 |
| $Cu_2O$ | 18337 | $CuCl_2$ | 219 | 22888 |
| ZnO | 16217 | $ZnCl_3$ | 1894 | 90019 |

Solubility of the oxide is provided within malonic acid mixed in a eutectic or near-eutectic ratio with deep eutectic solvents such as choline chloride to suppress the freezing temperature. In some embodiments, the composition of the malonic acid complex is liquid from 80° C. to 100° C., depending on mole fraction. Also, while oxides are used in some embodiments, in other embodiments, other compounds, such as chlorides and the like, may be used. Oxides were selected for some embodiments due to the ability to alter their stability by changing the partial pressure of oxygen in the bonding environment. A 1:2 mixture of choline chloride with carbamide has also been provided to show how solubility changes with temperature. These mixtures melt at less than 100° C., sufficiently low that there should be no damage to the IMM cell. Eutectic solutions involving copper oxides are of interest due to their high solubility, temperature sensitivity, and spinel forming tendency.

Figure 3:
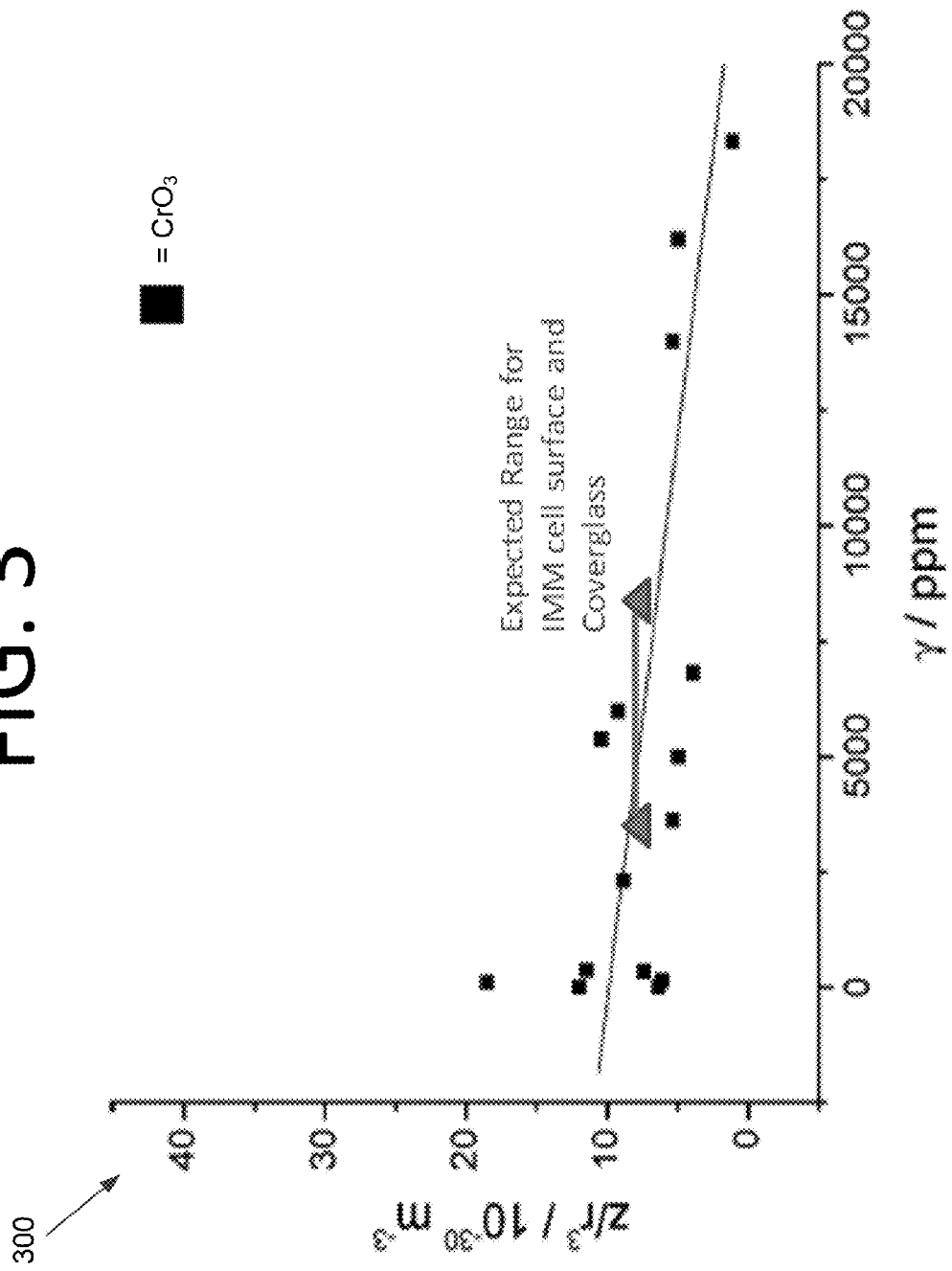
FIG. 3 is a graph illustrating the ratio of electric charge to crystal ionic radius against solubility, according to an embodiment of the present invention.

A rough estimation of the solubility of other oxides can be made by considering physical property data for Ga, Ge, and Si. A relationship between ionic properties and observed solubility can be made. This is shown in graph 300 of FIG. 3, where the ratio of electric charge to crystal ionic radius has been plotted against solubility. Also shown in graph 300 is the predicted solubility of silicon for the IMM-to-coverglass couple, suggesting that a eutectic compound exists between the interlayer and parent materials.

The onset of the joining process in some embodiments of the present invention includes placing two surfaces in contact and heating them to the liquid melting temperature. One side of the coverglass may have been treated with the interlayer material, which is solid when contacted to the solar cell surface. As the interlayer melts, the solar cell surface is wet with liquid that has minimal solubility. Under these conditions, the system behaves as a constrained capillary vessel, relaxing wetting angle constraints and permitting the interlayer to spread uniformly without voids over the solar cell surface. The situation can be mathematically described using the following equation for minimization of total surface energy:

$$(Gls+Glc-(Gvc+Gvs)<0 \tag{1}$$

where Gls is the surface tension between the cell surface and the interlayer liquid and Glc represents the interlayer and the coverglass. Similar terms are included for the vapor interface represented by "v". This equation is essentially a force balance describing the stability of the liquid.

Film thickness is a function of surface tension between liquid and solid surfaces as well as capillary pressure according to:

$$P=Gxl[(1/t)+(1/R)] \tag{2}$$

where t and R are the radius of curvature in orthogonal directions at the solidification front. Under normal solidification, capillary force P is opposed by thermal gradient-generated forces. In this situation, however, those forces are related to the compositional gradient. For a deep eutectic solvent (DES) represented by common solvents, an expected surface tension of approximately 25 dynes/cm should be observed in some embodiments. Factoring uncertainty into these estimates, bondline thickness could be between 5 and 50 microns in some embodiments.

An intimate relationship exists between bondline thickness, coverglass thickness and coverglass interconnect cell (CIC) device performance. Vendors manufacturing glass for defense applications typically supply 100 micron thick material for use in geostationary Earth orbit (GEO), but have noticed an increased number of requests for 50 micron and thinner coverglass. Motivation from prime contractors appears to be mass savings at the expense of heat rejection and possibly compromised UV stability. Insertion of glasslike bond layers would generally increase apparent coverglass thickness, altering thin material transmission characteristics. From a process point of view, interlayer thickness can be modified by with solubility or surface energy parameters once quantified.

Following wetting of the surfaces, solidification proceeds according to planar diffusion. This occurs in two steps. The first involves constant temperature consumption of the liquid according to the phase diagram. Liquid phase diffusion restores equilibrium according to the phase diagram of the material. Once complete, solid state diffusion proceeds in an attempt to minimize the concentration gradient between the interlayer and the coverglass. Since the interlayer is a surface layer on the glass, the remainder acts as a "sink" as diffusion proceeds. Fick's law enables calculation of solidification behavior as liquid is consumed at constant temperature. Using planar boundary conditions and constant diffusivity, the solution to Fick's law has the form:

$$C = C''' \mathrm{erfc}\left(\frac{x}{2\sqrt{Dt}}\right) \tag{3}$$

The concentration of liquid between the cover glass and the cell C is a function of the diffusion coefficient D and time t. The bond layer thickness is represented as x. This solution is useful for estimating solidification and homogenization of the bond layer. Temperature is included in the above expression as a component in the calculation of diffusivity. D is defined as:

$$D=D''e^{-Q/RT} \tag{4}$$

Where D" is considered constant and related to physical parameters of the transported species, Q is an activation energy, R is the gas constant, and T is the temperature. Initial calculations indicate that for the DES mentioned above, solidification should be completed within about 2 hours followed by homogenization, which completes in a little over 20 hours. The difference in these times is the result of relatively high diffusion for liquid vs. solid state diffusion. For example, diffusivity within liquid solvents is approximately 10EE-4 $cm^2/s$ compared to 10EE-13 $cm^2/s$ for solids.

Temperature exerts significant influence on solidification rates even in situations where the activation energy is high. In this concept, bonding is expected to be conducted just below the maximum long term survival temperature. The solid state diffusion step is generally necessary for increasing the remelt temperature to greater than 180° C. and restoring optical properties across the interface. Homogenization time may also be decreased if cell performance plateaus sooner than expected.

Figure 4:
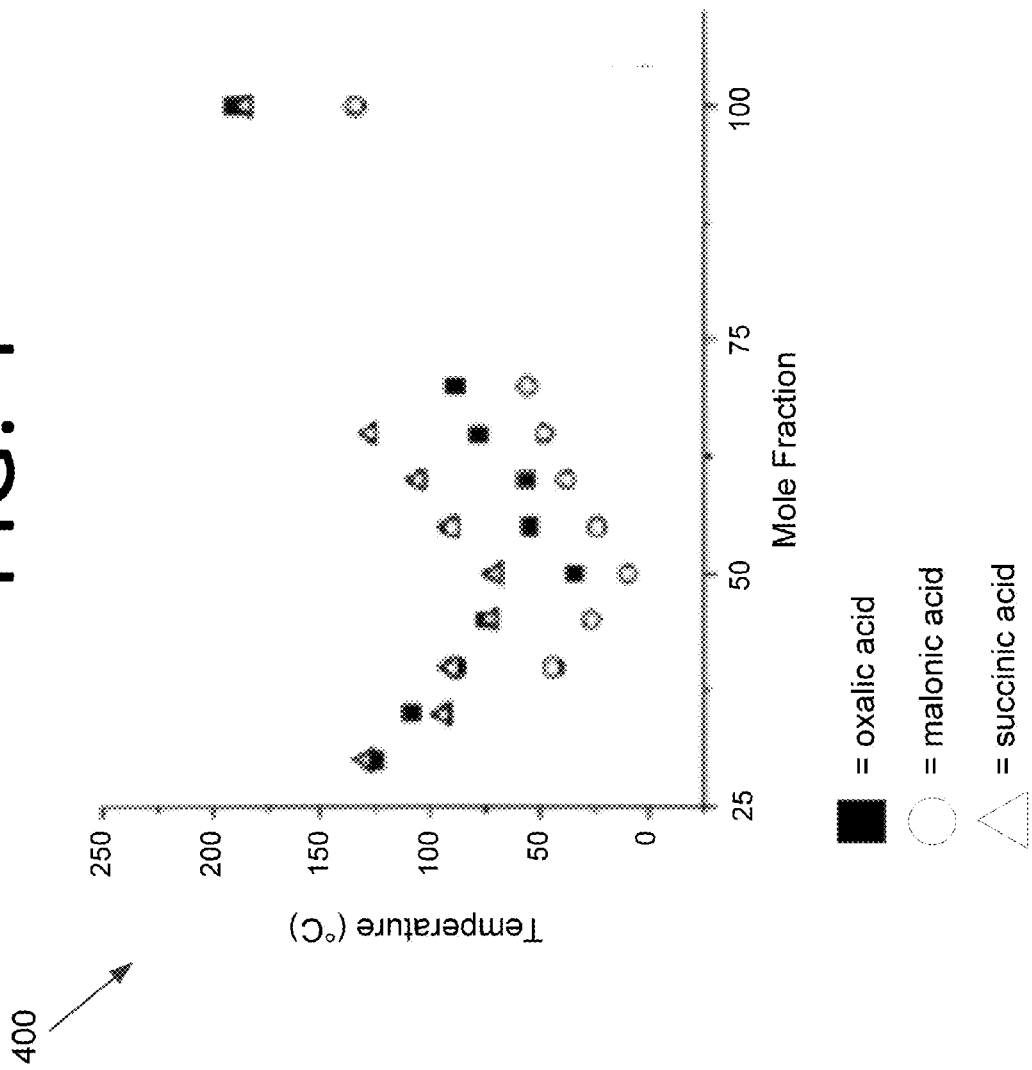
FIG. 4 is a graph plotting mole fraction against temperature for three acids, according to an embodiment of the present invention.

Significant suppression in melting point has been shown for alloys of choline chloride and malonic acid or carbamide, see graph 400 of FIG. 4. Although these results indicate the correct trend, it may be necessary to demonstrate melting point suppression of these films when applied to solar cell coverglass. These results, shown in graph 500 of FIG. 5, indicate the change in behavior as a function of a "composition factor" defined as the molar fraction of choline chloride to malonic acid modified by a solubility factor. A composition factor of greater than 0.4 is generally required to develop a liquid layer. Increasing the composition factor beyond 0.4 results in higher temperatures required to melt the interface up to a composition factor of 0.9, beyond which the interface is always liquid. Liquid formation and bond adhesion is the result of melting point suppression and solubility, as indicated in Table 1. The process window associated with FIG. 5 lies between composition factors of 0.7 and 0.9, providing a sufficiently low temperature such that solar cell junctions are not degraded, yet a sufficiently high temperature that diffusion processes are kinetically favorable. This is generally necessary so that that isothermal solidification and solid state diffusion events complete in a reasonable time.

One of the benefits of some of the processes of the present invention is the ability to generate very thin interfaces, reducing solar array mass. In the context of satellites and vehicles operating in space, the cost of putting each pound of machinery into space can be thousands of dollars. Thus, any weight savings can be highly beneficial and advantageous from a cost perspective.

Since such methods generally result in well-controlled coverglass and reduced solar cell thickness, CICs (coverglassed, interconnected solar cells) used in assembly of photovoltaic blankets generally have higher stowage volumetric efficiency. Small thickness dimensions also reduce diffusion distances, improving process throughput since the time to remove joint signature by diffusion is reduced.

The relationship between solubility and surface tension is generally the primary quantity in determining joint thickness. In this case, low surface tension is a function of the composition factor. This is shown more clearly in FIG. 6, where joint thickness at a composition factor 0.65 is about one third that observed for higher composition factor values. Experimentally, for each of the four cases shown in FIG. 6, joint thickness was measured after a 10 hour exposure. Each coupon was held isothermally just under its liquidus temperature (see FIG. 5) during this period.

Figure 7:
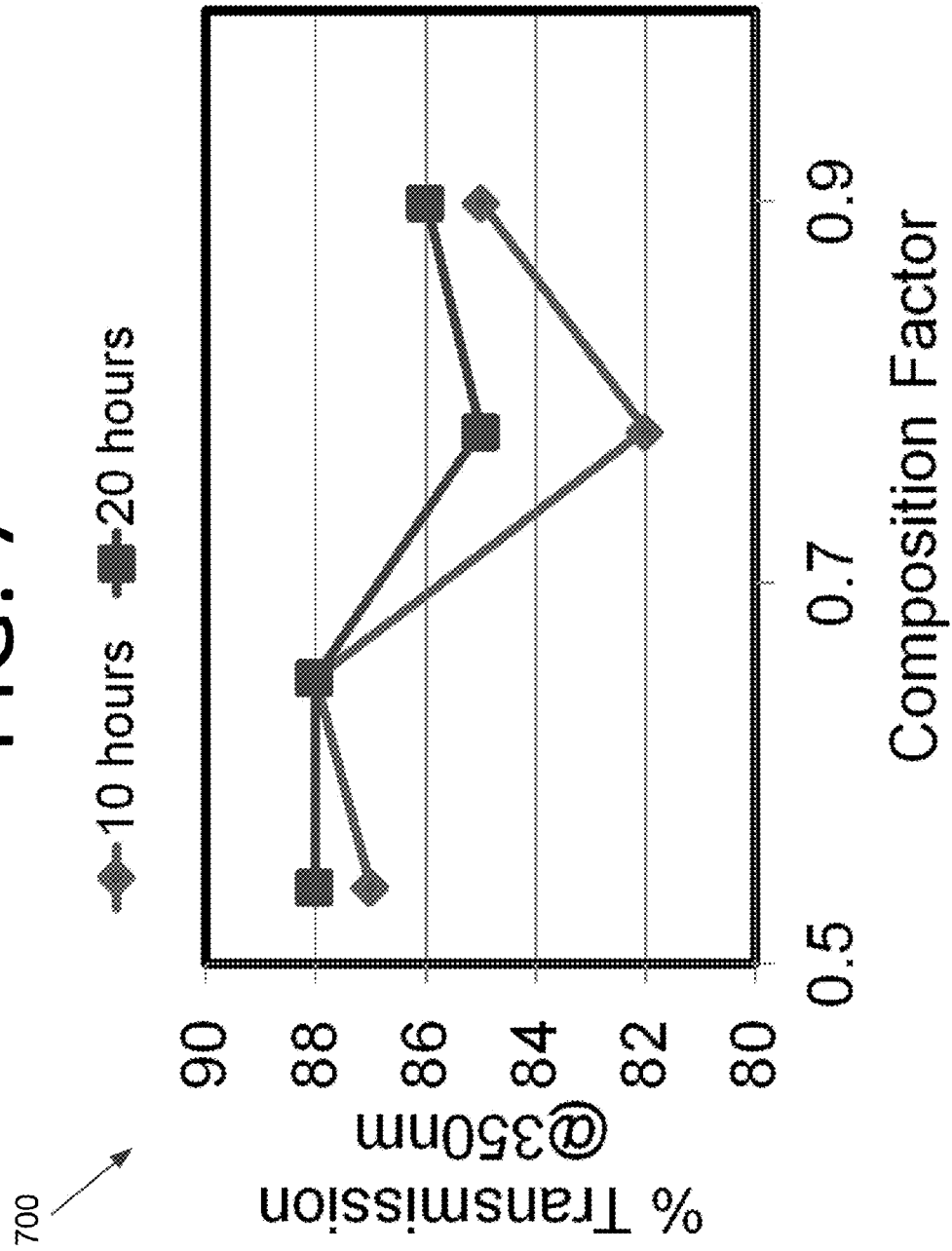
FIG. 7 is a graph illustrating the relationship between transmission and composition factor, according to an embodiment of the present invention.

Optical losses may be reduced by using thin bond layers. This provides more latitude in selecting bondline composition while maintaining high spectral transmission. Transmission data at 350 nm, just above the cutoff wavelength for typical coverglass, was measured as a function of composition factor. These results, provided in FIG. 7, indicate decreased transmission with increasing composition factor. Transmission was shown to improve after 20 hours at the liquidus temperature. This indicates that diffusion into the coverglass reduces the influence of bondline composition on optical performance. Diffusion tends to reduce the effective composition factor so that relatively poor results are not unexpected for composition factors above 0.65.

Figure 8:
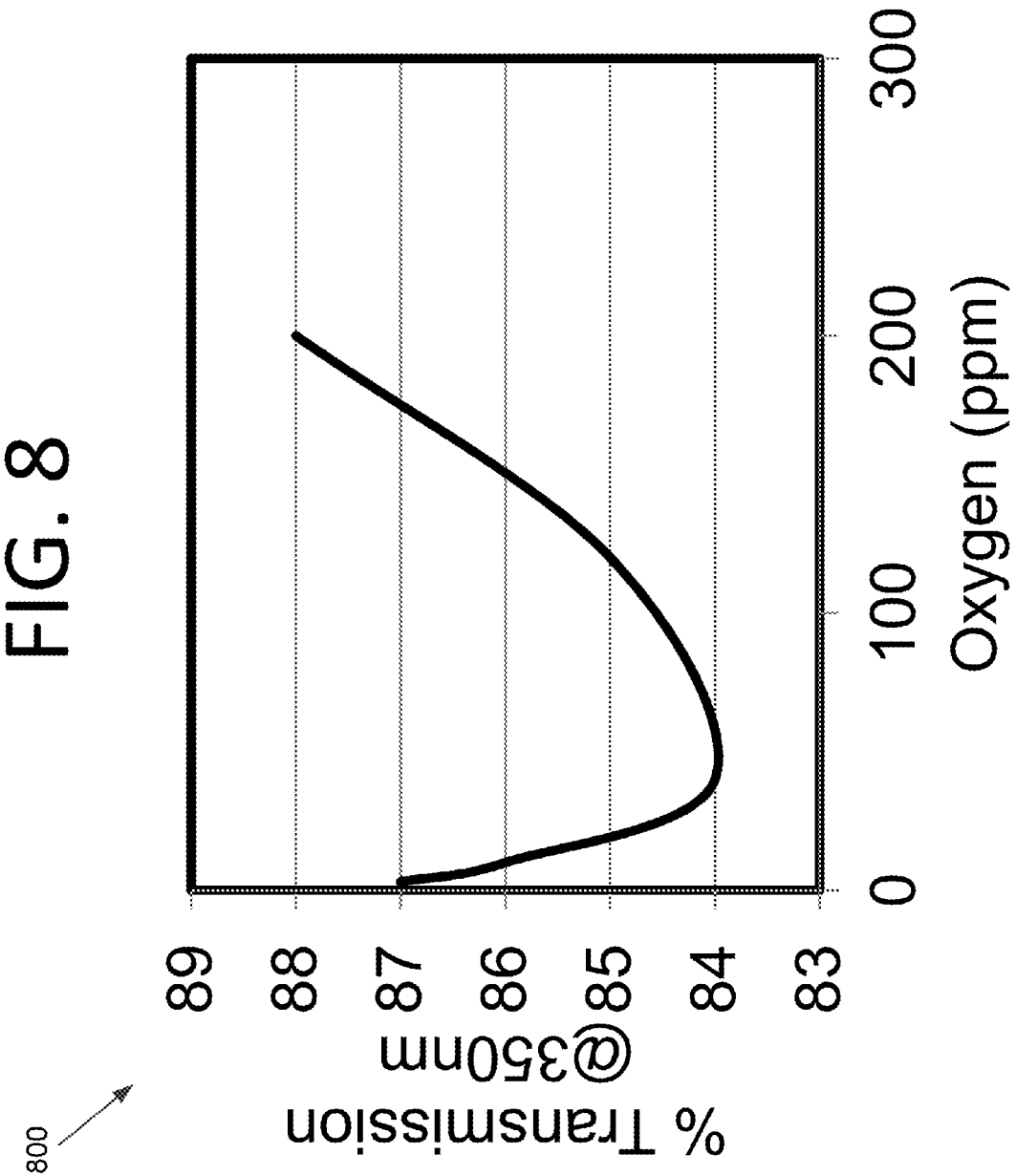
FIG. 8 is a graph illustrating the percentage of light transmission at 350 nm as a function of oxygen concentration, according to an embodiment of the present invention.

Atmospheric composition during bonding was also found to influence optical properties. The partial pressure of oxygen in argon was examined at a bonding temperature of 120° C. FIG. 8 shows a minimum in transmission where the amount of oxygen is around 50 ppm. It is believed that high oxygen concentrations result in complete formation of the spinel crystal structure and that excessively low concentrations do not allow isothermal solidification to proceed to completion.

Figure 5:
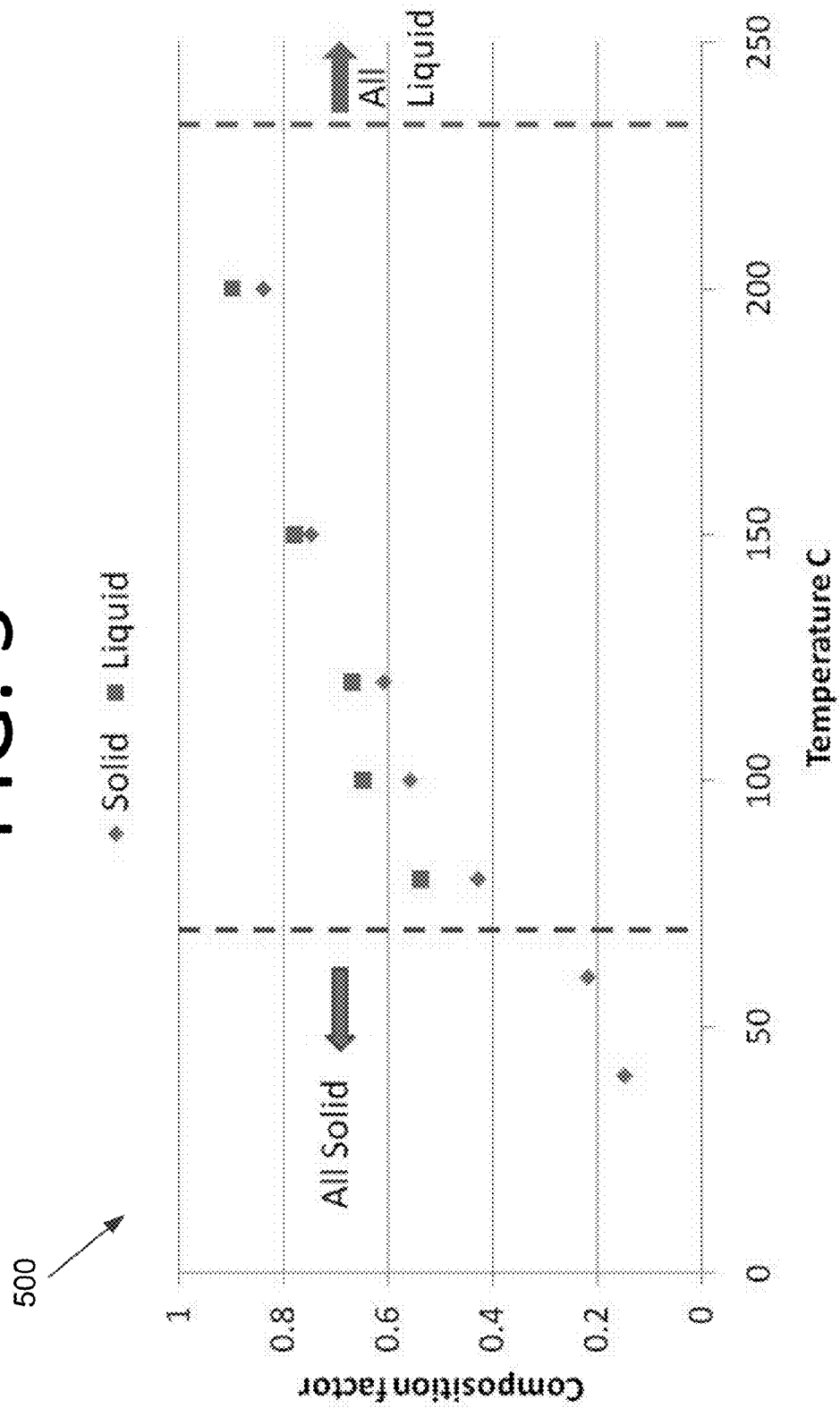
FIG. 5 is a graph plotting solid and liquid states as a function of temperature and composition, according to an embodiment of the present invention.
Figure 6:
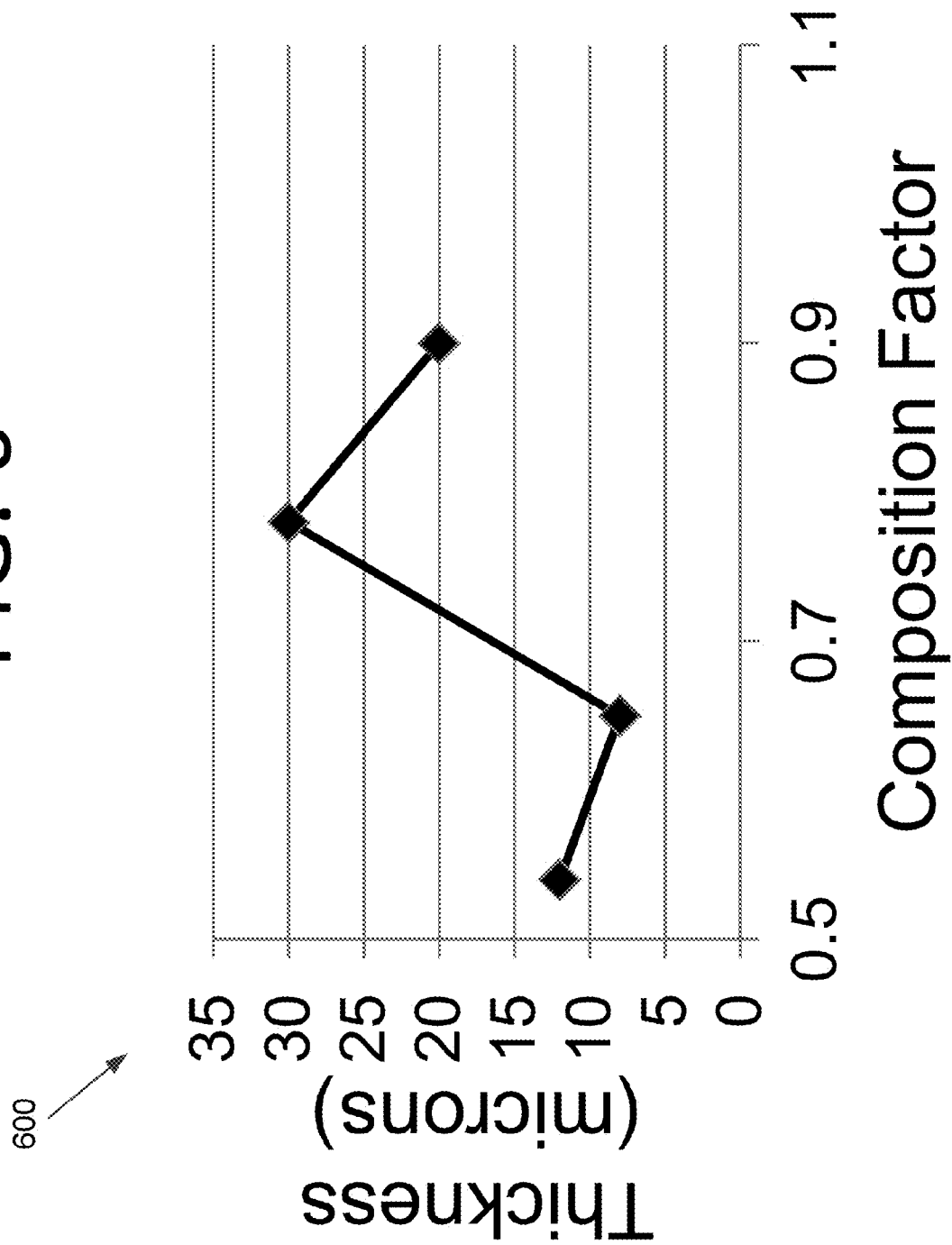
FIG. 6 is a graph illustrating the relationship between joint thickness and composition factor, according to an embodiment of the present invention.

As indicated in FIG. 5, melting point was suppressed to form a liquid layer that wets both the solar cell surface and the coverglass. If left in this condition and cooled to room temperature, the liquid would solidify by conventional freezing. However, if exposed to elevated temperature (greater than 100° C.) in a short time period (several minutes) the glass could slip off or be removed from the cell. To finish the CIC assembly, it is generally necessary to allow liquid-solid and solid-solid diffusion processes to proceed. As these processes proceed, the joint degradation temperature increases to greater than 200° C. and optical losses across the joint are reduced.

Figure 9:
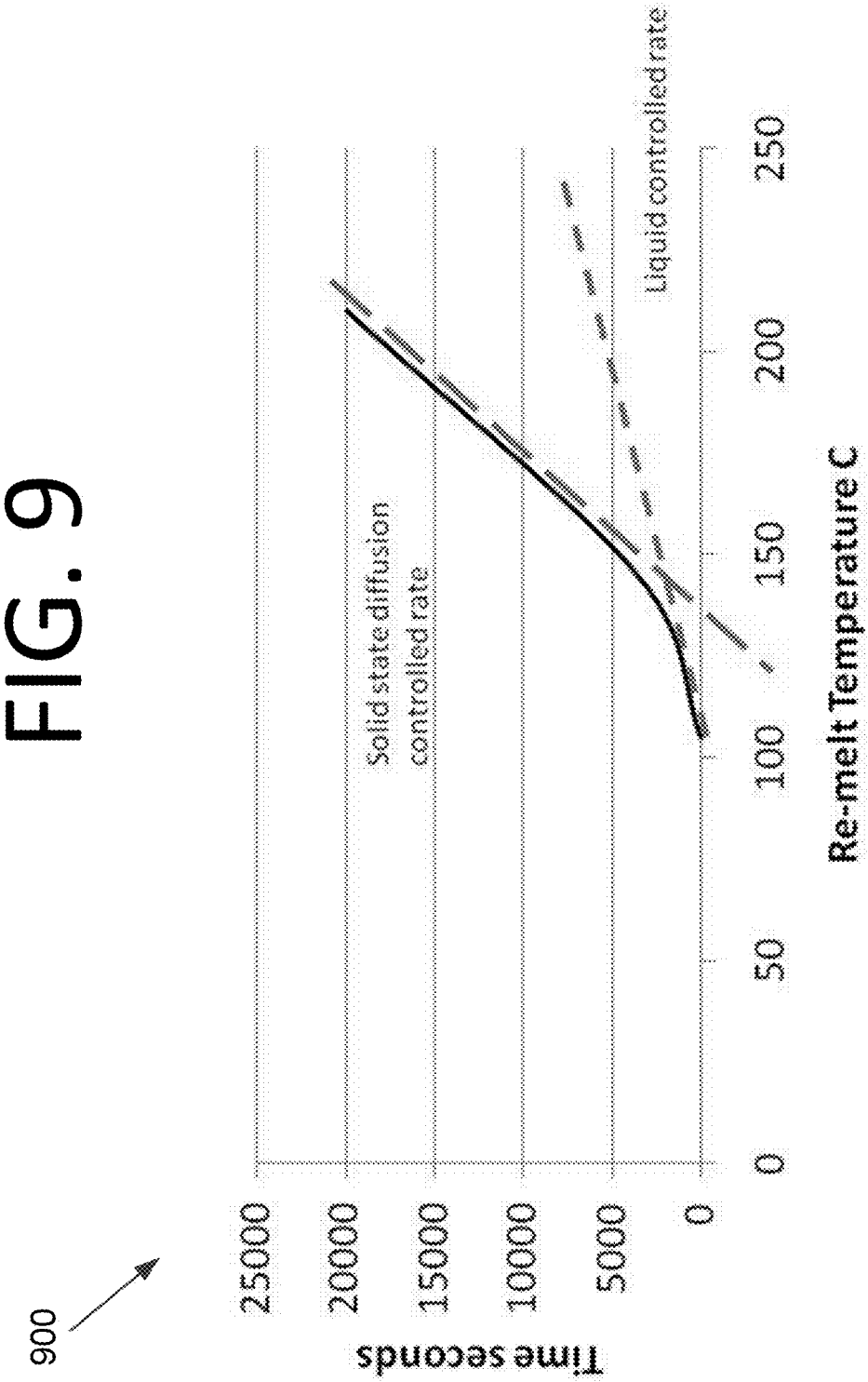
FIG. 9 is a graph illustrating remelt temperature over time, according to an embodiment of the present invention.

FIG. 9 illustrates the change in temperature for a composition factor of 0.65. In this case, remelt temperature has doubled within 6 hours. On orbit cell temperatures do not normally exceed 140° C., with 60° C. to 70° C. generally being the desired operating temperature.

An analytical expression for the above can be generated by applying plane boundary conditions to Ficks law. The solution results in governing equations (3) and (4) above. C and C" are concentration-dependent quantities, t is time, x is transport distance (taken to be the thickness of the liquid layer plus coverglass thickness), D is the diffusion coefficient, R is a universal constant, T is the temperature, and Q is the activation energy.

The change in slope shown in FIG. 9 at 140° C. indicates a mechanistic change as the last of the liquid layer is consumed and solidification continues by solid state diffusion. This is reasonable since the slope of these regions represents a change in activation energy and liquid diffusion is known to have lower activation energy Q than solid state diffusion. Knowledge of Q is beneficial since process variables such as temperature and joint composition can be changed and a new process time t can be calculated.

In summary, the process consists of establishing a low melting point, transient liquid phase in which oxides present on coverglass and solar cell surfaces are soluble. The thin liquid layer solidifies, isothermally using liquid phase diffusion followed by solid state diffusion. These diffusion steps are generally needed to increase joint remelt temperature above peak environmental exposure and increase joint strength. Diffusion primarily occurs in the coverglass, which acts as a reservoir (sink), substantially diminishing the signature of the previous liquid layer.

An initial indication of payoff for the integration approach relative to alternatives to some embodiments of the present invention is provided in Table 2 below.

TABLE 2

Integration Approach Parameters

| Method | IMM Compatible | Mechanical | Thermal | Optical | Space Environment | Total |
|---|---|---|---|---|---|---|
| Isotherm Solidify | 10 | 9 | 10 | 10 | 10 | 49 |
| Adhesive Bonding | 6 | 10 | 7 | 8 | 8 | 41 |
| Solidification | 10 | 7 | 10 | 10 | 8 | 45 |
| Fluoro Poly | 5 | 6 | 7 | 8 | 7 | 33 |

IMM Compatibility

Issues associated with handling and managing inverted metamorphic (IMM) cell have been briefly mentioned. In this scoring effort, the ability of the method in supporting IMM throughout the remainder of the integration process was assessed. Higher scores were given to methods that manage thin film properties, yet provide high stiffness platforms upon completion. Adhesive bonding receives a lower score since it results in a relatively thick bond layer. The fluorocarbon polymer (fluoro poly) is a bonding method investigated for MEMs biochip applications, and receives a low score for need to apply substantial pressure to the IMM and low stiffness, even though its bondline is 500 microns thick. The technique appears to be similar to Teflon® bonding procedures.

Thermal

Spinel interlayer structures have been reported to have good thermal conductivity and shock resistance. Spinels typically have thermal conductivity between 0.8 and 1.1 W/m-K, compared to silicone, which ranges from a 0.2 to 0.3 W/m-K coefficient of thermal expansion (CTE).

Optical

Electric performance data under AM0 illumination suggests reasonable performance between coupons with similar geometric attributes. Similarity in fill factor, open circuit voltage, and short circuit current, indicate that isothermal bonding wets the top junction surface, but did not diffuse in such as manner as to degrade electric behavior relative to silicon adhesion.

Space Environment

Exposure performance is expected to be better than adhesives with respect to outgassing. The solidification process gets low score from its inherent low remelt temperature. Radiation protection should be improved for both isothermal and direct solidification approaches over silicone bonding since mass thickness of the bond layer contributes to total coverglass thickness, further attenuating penetration exposure.

Limited test data obtained under standard processing indicate encouraging strength and electric performance results. Knoop harness, provided in Table 3, demonstrates reasonable consistency between parent materials joined by isothermal solidification and that these values are slightly less than measurement conducted on the parent material.

TABLE 3

| Hardness Values | | | | | |
|---|---|---|---|---|---|
| | Hardness Knoop | | | | |
| | 1 | 2 | 3 | 4 | Average |
| Sample I | 446 | 458 | 463 | 448 | 454 |
| Sample II | 438 | 441 | 457 | 478 | 453 |
| Borosilicate Glass | 468 | — | — | — | 468 |

In addition, glass was bonded to a typical solar cell surface to further assess process feasibility. It should be noted that IMMs will behave differently due to differences in mechanical and thermal properties, but surface compositions are expected to be similar. Close inspection of samples shows presence of porosity for an isothermal solidification bond. The cause of the porosity is likely the result of anti-reflection coatings on the glass. The glass used in the samples was a commercial product, not space grade material. Following isothermal solidification, a glass coupon was bonded adjacent to the isothermal solidification article using SOP optical silicone.

Figure 10:
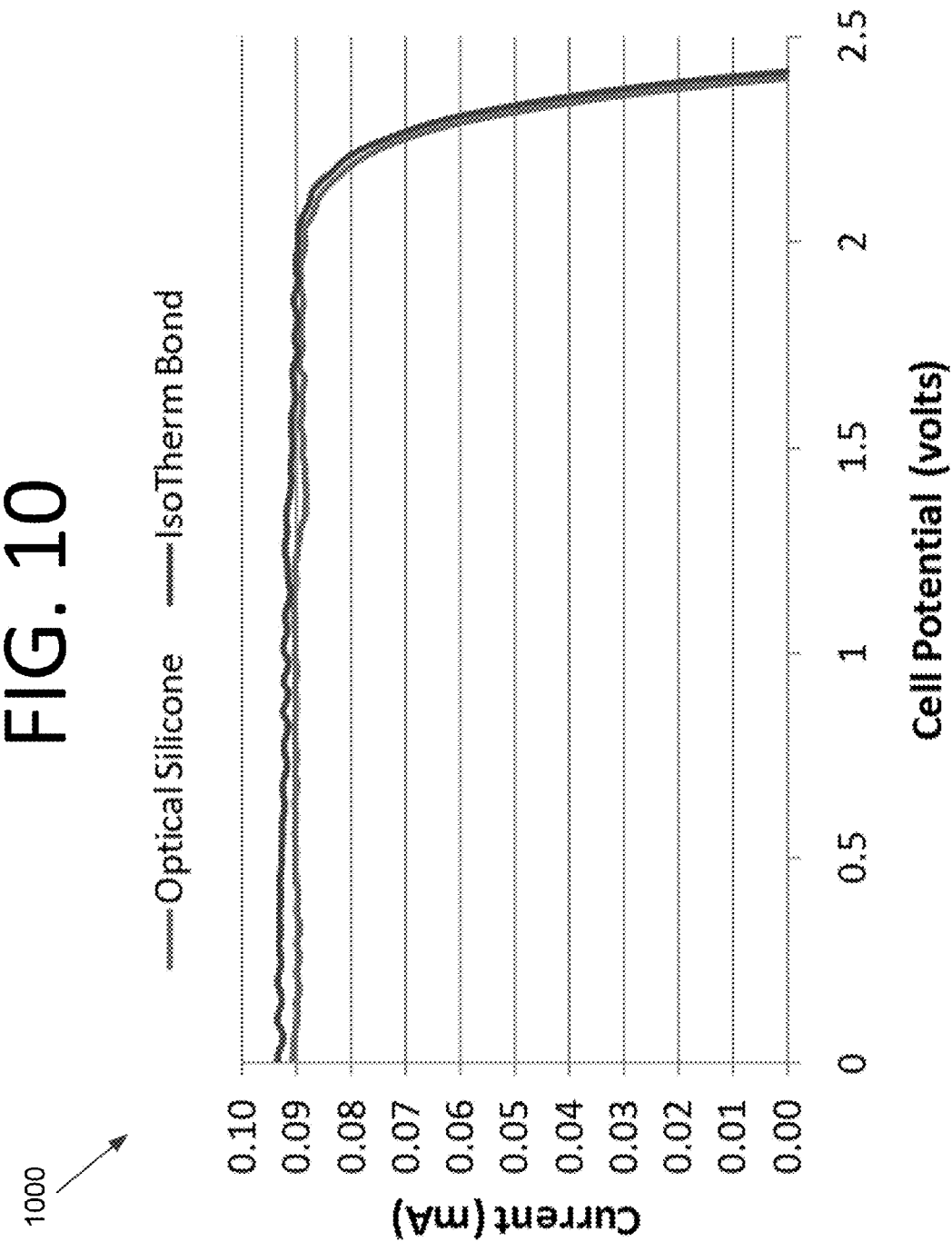
FIG. 10 is a graph illustrating electrical performance for isothermal joining relative to traditional practice, according to an embodiment of the present invention.

Electric performance for isothermal joining relative to traditional practice using NuSil® SCV2590 space qualified optical adhesive is shown in graph 1000 of FIG. 10. Current as a function of voltage was collected under air mass zero (AM0) simulated illumination using an X-25 source. AM0 is the spectral distribution and illumination intensity of solar cells exposed to a space environment. This is a standard environment roughly defined by an intensity of 1360 watts/$m^2$ and a specific wavelength distribution. Bare cells were exposed to the X-25 source to verify equivalent electric behavior prior to glass attachment.

Electric performance was evaluated for a number of isothermally bonded solar cells relative to a large area (24 $cm^2$) 28% efficient space-rated solar cells. The 28% reference cell was constructed with the same thickness of coverglass as the isothermally bonded cells, but attached with space grade optically transparent silicone adhesive. These results, provided in Table 4, show the change in open circuit voltage (Voc) and short circuit current (Isc) for a number of bonding cases. In general, bonded samples show minimal change in electric performance. The smallest changes were observed for sample IDs 7910 and 5210, which were bonded using a composition factor of 0.65 and an atmosphere of 80 ppm oxygen for 10 hours. Also, the process was extended to include IMM devices. Initial results of electric potential as a function of device current indicate less than a 2% change in peak power relative to adhesive bonding.

TABLE 4

Percentage Change in Voc and Isc of Isothermally Bonded Solar Cells Relative to a 28% AM0 Reference Device Glassed with Optical Silicone

| Sample ID | 05210 | 06410 | 06510 | 07910 | 09010 | 06520 |
|---|---|---|---|---|---|---|
| Voc (%) | −0.15 | −0.5 | 0.21 | 0.05 | −0.02 | 0.09 |
| Isc (%) | −0.5 | −2.8 | −0.8 | −0.6 | −1.8 | −1.1 |

Figure 11:
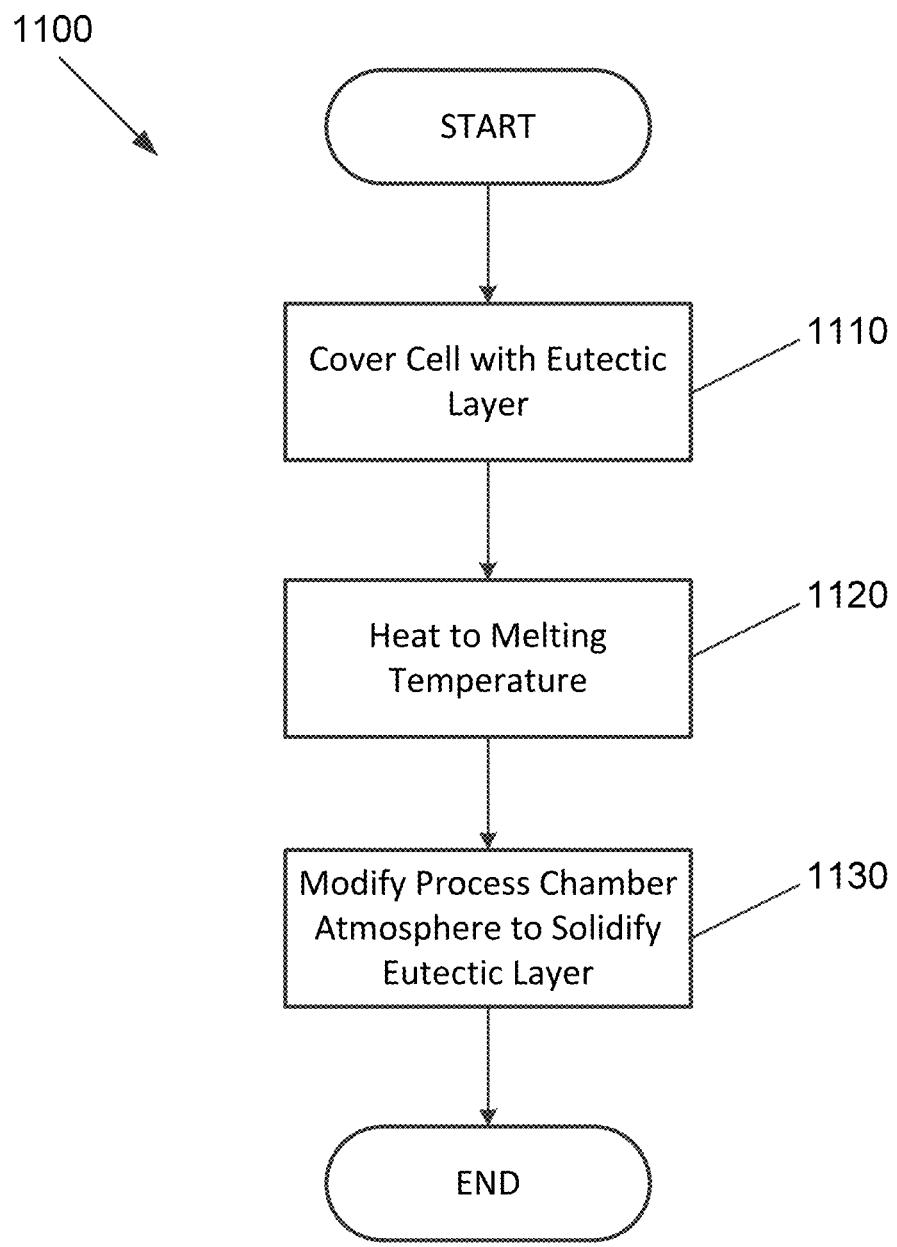
FIG. 11 is a flowchart illustrating a method for creating a transparent cell covering using a eutectic layer without a separate transparent covering, according to an embodiment of the present invention.

FIG. 11 is a flowchart 1100 of a process for creating a transparent cell covering using a eutectic layer without a separate transparent covering, according to an embodiment of the present invention. A photovoltaic cell is covered with a eutectic layer at 1110. The process chamber is then heated to the melting temperature of the eutectic layer at 1120. However, in some embodiments, the process chamber may be heated first and the eutectic layer may be applied to the cell in a liquid state. Generally, the eutectic layer should be positioned, deposited, or otherwise applied so as to evenly coat the surface of the cell.

The atmosphere in the process chamber is adjusted at 1130 such that diffusion occurs from the liquid eutectic layer to the surrounding gas, resulting in isothermal solidification. After solidification has occurred, the process is complete and the photovoltaic cell with its transparent eutectic layer covering is ready for use.

Figure 12:
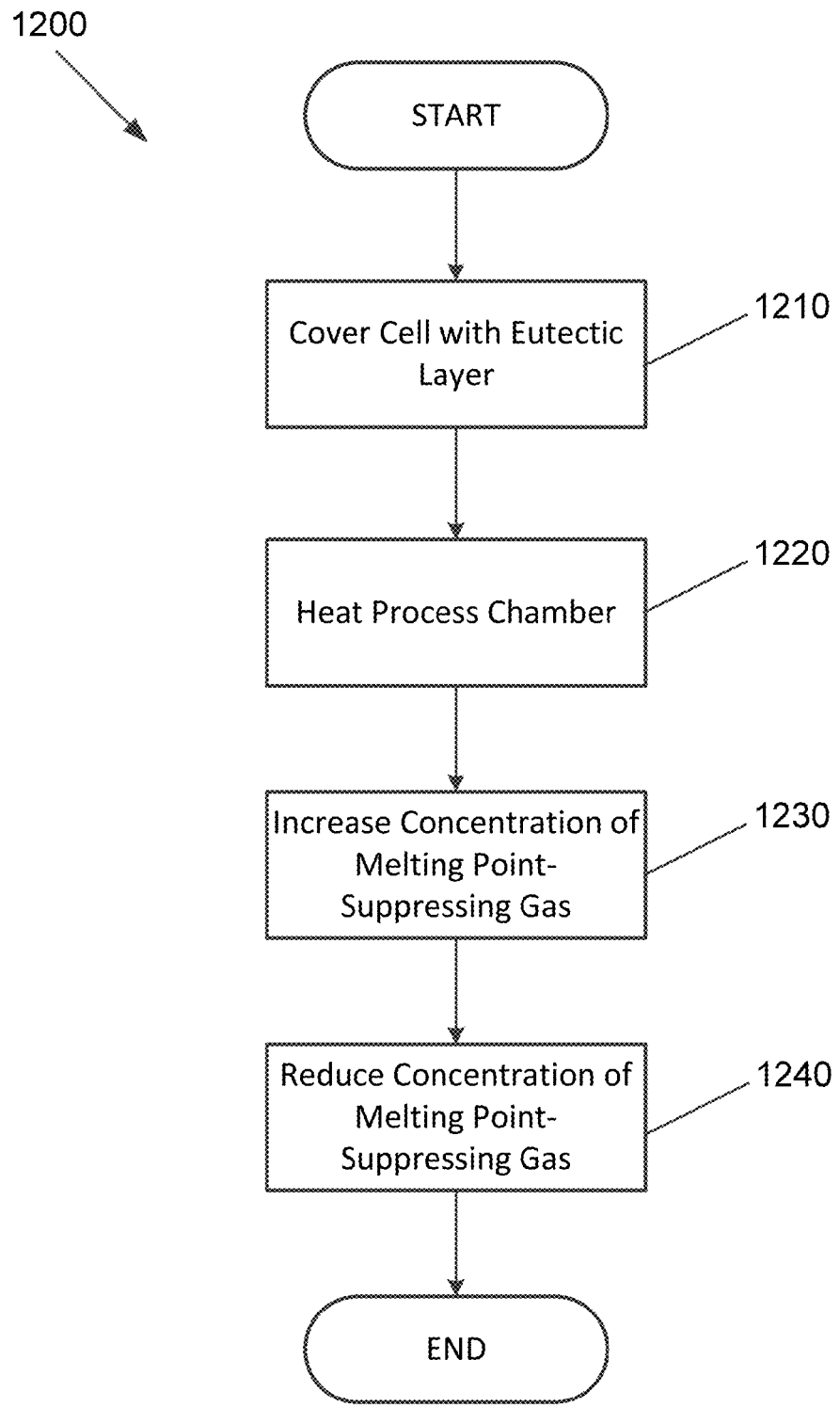
FIG. 12 is a flowchart illustrating another method for creating a transparent cell covering using a eutectic layer without a separate transparent covering, according to an embodiment of the present invention.

FIG. 12 is a flowchart 1200 of another process for creating a transparent cell covering using a eutectic layer without a separate transparent covering, according to an embodiment of the present invention. A photovoltaic cell is covered with a eutectic layer at 1210 and the process chamber is heated at 1220. However, unlike the process of FIG. 11, the temperature is not heated high enough that the eutectic layer melts. In such embodiments, a component of the gas may be responsible for suppressing the melting point of the liquid layer. For example, oxygen, water vapor, or any other suitable element may be used to suppress the melting point of an optically transparent material (i.e., the liquid layer).

The concentration of the melting point-suppressing gas is increased at 1230, causing the eutectic layer to melt. The concentration of the melting point-suppressing gas is then reduced at 1240, causing the eutectic layer to solidify. The process results in a transparent eutectic layer covering without the need for a separate covering.

Some embodiments of the present invention bond a transparent covering to solar cells using a eutectic interlayer material. When heated, the eutectic interlayer material melts at a temperature that does not damage the solar cells. A compound within the eutectic interlayer material then bonds with the transparent covering, increasing the melting temperature of the remaining eutectic interlayer material and causing the interlayer to solidify. Once solidified, the interlayer material bonds the solar cells and the transparent covering together, forming a thin (less than 50 microns in many embodiments) bonding layer that bonds the solar cells and the transparent covering together.

In some embodiments, a separate transparent covering is not needed. The atmosphere in the process chamber may be adjusted such that diffusion occurs from the liquid eutectic layer to the surrounding gas, resulting in isothermal solidification. Alternatively, a component of the gas responsible for suppressing the melting point of the liquid layer may be altered by changing the composition of this component in the surrounding atmosphere. These processes create a "virtual" coverglass once the eutectic layer solidifies on the surface of the cell.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

We claim:

1. A method, comprising:
    placing a eutectic layer in a solid or liquid state in contact with or close proximity to a solar cell;
    when in a solid state, heating the eutectic layer to a sufficiently high temperature to transition to a liquid state;
    wetting a surface of the solar cell with the liquid eutectic layer, forming an interlayer that covers surface components of the solar cell;
    contacting a transparent covering to the interlayer; and
    modifying a chemistry of the interlayer such that the interlayer solidifies on the surface of the solar cell, forming a transparent layer between the transparent covering and the solar cell.

2. The method of claim 1, wherein at least some of a compound of the interlayer bonds with the transparent covering, raising a melting temperature of the interlayer and causing the interlayer to solidify and bond with the solar cell and the transparent covering.

3. The method of claim 1, wherein the solar cell comprises an inverted metamorphic photovoltaic device (IMM).

4. The method of claim 1, wherein a compound of the interlayer comprises an oxide.

5. The method of claim 1, wherein the modifying of the chemistry of the interlayer comprises introducing a gas to a process chamber that causes the interlayer to solidify.

6. The method of claim 1, wherein the interlayer comprises at least one quaternary salt.

7. The method of claim 1, wherein the solar cell is heated to a temperature no greater than 300° C.

8. The method of claim 1, wherein the temperature is held constant while solidification of the interlayer occurs.

* * * * *